(12) United States Patent
Braganca, Jr. et al.

(10) Patent No.: US 11,817,357 B2
(45) Date of Patent: Nov. 14, 2023

(54) REGION-OF-INTEREST POSITIONING FOR LASER-ASSISTED BONDING

(71) Applicant: STATS ChipPAC Pte. Ltd., Singapore (SG)

(72) Inventors: Wagno Alves Braganca, Jr., Incheon (KR); KyungOe Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 356 days.

(21) Appl. No.: 17/342,935

(22) Filed: Jun. 9, 2021

(65) Prior Publication Data

US 2022/0399236 A1     Dec. 15, 2022

(51) Int. Cl.
*H01L 21/66* (2006.01)
*H01L 23/00* (2006.01)
(Continued)

(52) U.S. Cl.
CPC ............ *H01L 22/12* (2013.01); *G06T 7/13* (2017.01); *G06T 7/136* (2017.01); *H01L 24/75* (2013.01); *H01L 24/81* (2013.01); *H04N 5/33* (2013.01); *G06T 2207/10048* (2013.01); *G06T 2207/20164* (2013.01); *G06T 2207/30148* (2013.01);
(Continued)

(58) Field of Classification Search
CPC . H01L 2224/81224; H01L 2224/75261; H01L 2224/76261; H01L 2224/77261; H01L 2224/78261; H01L 2224/79261; H01L 2224/75158; H01L 2224/76158; H01L 2224/77158; H01L 2224/79158; H01L 2224/82214; H01L 2224/83224; H01L 2224/84214; H01L 2224/85214; H01L 2224/86214; H01L 2224/75753; H01L 2224/76753; H01L 2224/77753; H01L 2224/78753; H01L 2224/79753; H01L 2224/80143; H01L 2224/95121; H01L 2224/80121; H01L 2224/81121; H01L 2224/82121; H01L 2224/83121; H01L 2224/84121; H01L 2224/85121; H01L 2224/86121; H01L 24/75–79; H01L 21/68; H01L 2021/60067;
(Continued)

(56) References Cited

U.S. PATENT DOCUMENTS

| 4,404,453 | A | 9/1983 | Gotman |
| 9,916,989 | B2 | 3/2018 | Yoon et al. |
| 2021/0296268 | A1* | 9/2021 | Braganca, Jr. ........ H01L 23/544 |

FOREIGN PATENT DOCUMENTS

KR          102208065 B1      1/2021

* cited by examiner

*Primary Examiner* — David A Zarneke
(74) *Attorney, Agent, or Firm* — Brian M. Kaufman; Robert D. Atkins; Atkins and Associates, P.C.

(57) ABSTRACT

A semiconductor device is formed by providing a semiconductor die. A laser-assisted bonding (LAB) assembly is disposed over the semiconductor die. The LAB assembly includes an infrared (IR) camera. The IR camera is used to capture an image of the semiconductor die. Image processing is performed on the image to identify corners of the semiconductor die. Regions of interest (ROI) are identified in the image relative to the corners of the semiconductor die. Parameters can be used to control the size and location of the ROI relative to the respective corners. The ROI are monitored for temperature using the IR camera while LAB is performed.

25 Claims, 10 Drawing Sheets

(51) Int. Cl.
   *G06T 7/13*      (2017.01)
   *G06T 7/136*     (2017.01)
   *H04N 5/33*      (2023.01)

(52) U.S. Cl.
   CPC ............... *H01L 2224/75263* (2013.01); *H01L 2224/75901* (2013.01); *H01L 2224/812* (2013.01); *H01L 2224/81908* (2013.01)

(58) Field of Classification Search
   CPC ..................... H01L 2021/60075; H04N 5/33; H04N 23/20; G06T 7/12; G06T 7/13; G06T 2207/20164
   See application file for complete search history.

REGION-OF-INTEREST POSITIONING FOR LASER-ASSISTED BONDING

FIELD OF THE INVENTION

The present invention relates in general to semiconductor devices and, more particularly, to a device and method for positioning regions of interests during laser-assisted bonding.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Many aspects of the manufacturing process become problematic and must be improved or replaced when semiconductor devices are reduced in size. Semiconductor die are typically mounted onto a substrate by disposing solder bumps of the semiconductor die in contact with contact pads of the substrate. The assembly is heated in an oven to reflow the solder bumps and thereby attach the semiconductor die to the substrate.

As semiconductor die, along with accompanying interconnect structures, are made smaller and thinner, the impact of the reflow oven process is more damaging to the electrical parts. Laser-assisted bonding (LAB) has been adopted as an improved solution. LAB uses a laser to apply energy directly to the back side of the die being mounted, which is converted to thermal energy to reflow solder bumps on the front side of the die. LAB provides more localized heat than a reflow oven and is able to reflow bumps with a shorter cycle time. The result is that LAB can be used to mount a die to a substrate with a reduced likelihood of damaging thin die and interconnect layers.

An important aspect of LAB is the use of an infrared (IR) camera to monitor the temperature of the die in real time. The temperature is monitored inside specific areas of the die known as regions-of-interest (ROI). Currently, the IR camera is positioned manually by an engineer, and then specific pixels on the IR camera are monitored as ROI to maintain acceptable temperatures. The manual IR camera placement is susceptible to human error that can cause the ROI locations to be misplaced. Reliably replicating ROI positioning is difficult. Accordingly, a need exists for an improved method and system for aligning the IR camera to regions-of-interest during laser-assisted bonding.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental protection. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contacts within the package. The electrical connections can be made with conductive layers, bumps, stud bumps, conductive paste, bond wires, or other suitable interconnect structure. An encapsulant or other molding material is deposited over the package to provide physical support and electrical isolation. The finished package is then inserted into an electrical system and the functionality of the semiconductor device is made available to the other system components.

Figure 1A:
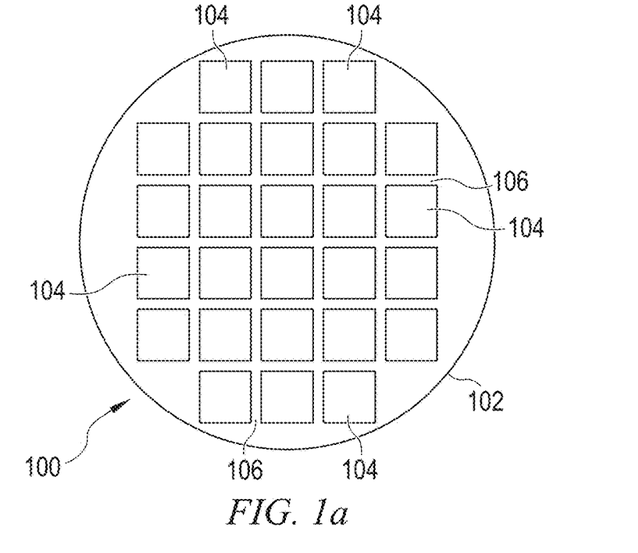
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figures 1B, 1C:
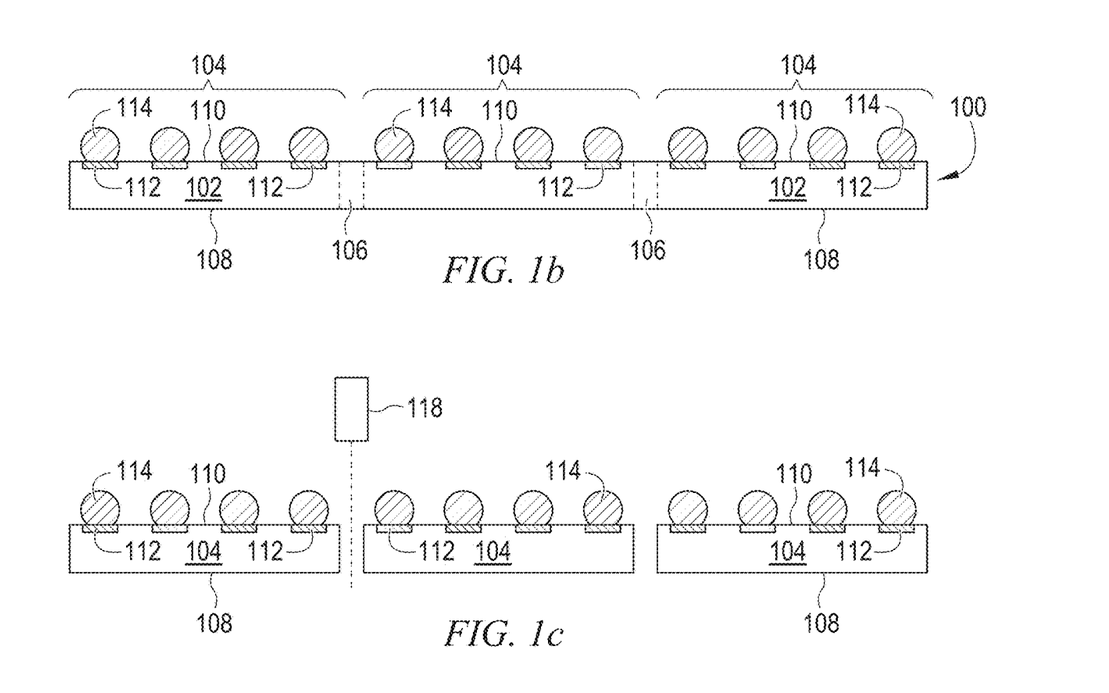

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), power amplifier, application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, combinations thereof, or other suitable conductive materials with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under-bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation.

Figure 2A:
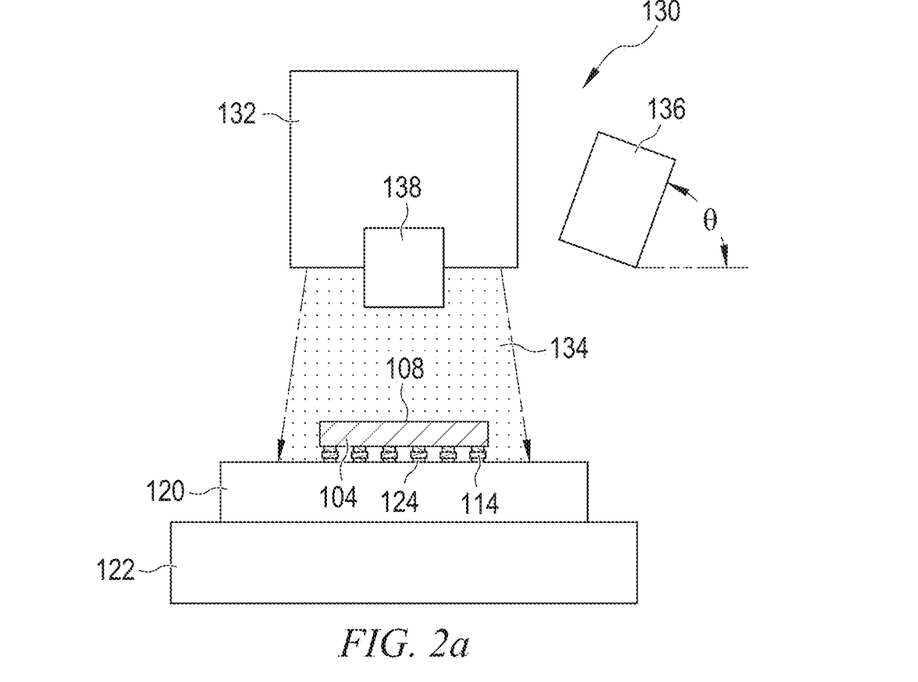
FIGS. 2a-2h illustrate region-of-interest (ROI) alignment.

To incorporate semiconductor die 104 into an electronic device, bumps 114 are typically reflowed onto contact pads 124 of a larger substrate 120 as shown in FIG. 2a. A pick and place machine is used to place semiconductor die 104 onto substrate 120 at the desired location, and then laser-assisted bonding (LAB) is used to reflow bumps 114 onto contact pads 124. Flux is optionally added onto bumps 114 to improve reflow of the solder material onto the surfaces of contact pads 124. Non-conductive paste, non-conductive film, anisotropic conductive paste, and other suitable materials can be used instead of flux 126.

FIG. 2a shows a partial cross-sectional view of a carrier 122 having substrate 120 disposed thereon. Carrier 122 is a flat sheet of organic material, glass, silicon, polymer, or any other material suitable to provide physical support of substrate 120 during the manufacturing process. An optional double-sided tape, thermal release layer, UV release layer, or other appropriate interface layer can be disposed between carrier 122 and substrate 120.

Substrate 120 is formed from a base insulating material with conductive layers 124 formed over top and bottom surfaces of the interposer and interleaved between layers of the insulating material. Conductive layers 124 include contact pads, conductive traces, and conductive vias configured as necessary to implement a desired signal routing. Portions of conductive layers 124 are electrically common or electrically isolated depending on the design and function of the device being formed. Conductive layers 124 can be one or more layers of Al, Cu, Sn, Ni, Au, Ag, or other suitable electrically conductive material. In some embodiments, passivation or solder resist layers are formed over the top and bottom surfaces of substrate 120 with openings to expose contact pads of conductive layer 124.

Substrate 120 can also be any suitable laminate interposer, PCB, wafer-form, strip interposer, leadframe, or other type of substrate. Substrate 120 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating material of substrate 120 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Substrate 120 can also be a multi-layer flexible laminate, ceramic, copper clad laminate, glass, or semiconductor wafer including an active surface containing one or more transistors, diodes, and other circuit elements to implement analog or digital circuits. Substrate 120 can be any suitable substrate for a semiconductor package or electronic device.

In laser-assisted bonding, a LAB assembly 130 is disposed over semiconductor die 104 with the semiconductor die sitting on substrate 120. LAB assembly 130 is mounted onto a gantry that allows the X-Y position of the LAB assembly to be controlled. X-Y position means that the position can be controlled along the X and Y axes, but not necessarily the Z-axis. The X-Y plane is oriented parallel to the major surfaces of substrate 120. The X-axis is the axis that extends left-to-right in FIG. 2a and the Y-axis is the axis that extends into and out of the page of FIG. 2a. The Z-axis is oriented up-down in FIG. 2a, perpendicular to the major surfaces of substrate 120. The gantry that LAB assembly 130 is attached to may allow Z-axis (vertical) movement in some embodiments if desired.

LAB assembly 130 includes a laser homogenizer 132. Homogenizer 132 receives a laser beam input via a fiber optic cable, waveguide, or other suitable mechanism, and outputs a homogenized laser beam 134 over semiconductor die 104. A beam homogenizer is a device that smooths out the irregularities in a laser beam profile and creates a more uniform one. Most beam homogenizers use a multifaceted mirror with square facets. The mirror reflects light at different angles to create a beam with substantially uniform power across the entire profile of beam 134.

The energy of beam 134 is absorbed by semiconductor die 104 and converted to thermal energy to reflow bumps 114. In some embodiments, back surface 108 includes an electrically conductive layer formed over semiconductor die 104 as an electromagnetic interference (EMI) shielding layer. The conductive layer also improves efficiency of conversion from laser energy to thermal energy during LAB. Back surface 108 can also have other types of laser absorbing layers formed from any material that increases the absorption of the laser's energy.

Numerous substrates 120 and semiconductor die 104 are placed on carrier 122 at the same time, and LAB assembly 130 is moved by the gantry to perform LAB one at a time on each die. After one semiconductor die 104 has been processed, vision camera 138 is used to align LAB assembly 130 over the next die by finding fiducial markers on substrate 120 or by identifying the corners of the die. The gantry moves LAB assembly 130 until laser homogenizer 132 is aligned with the next semiconductor die 104 as reported by vision camera 138.

An infrared (IR) camera 136 is attached to LAB assembly 130 and positioned off to the side of laser homogenizer 132. Due to the positioning of IR camera 136, the IR camera typically needs to be tilted at an angle theta (θ) to properly view die 104. The angle θ is typically about 70 degrees but can vary. IR camera 136 provides a thermal image of semiconductor die 104 during the LAB process. The thermal image is used to monitor temperatures of semiconductor die 104 in real time while LAB is performed.

Figure 2B:
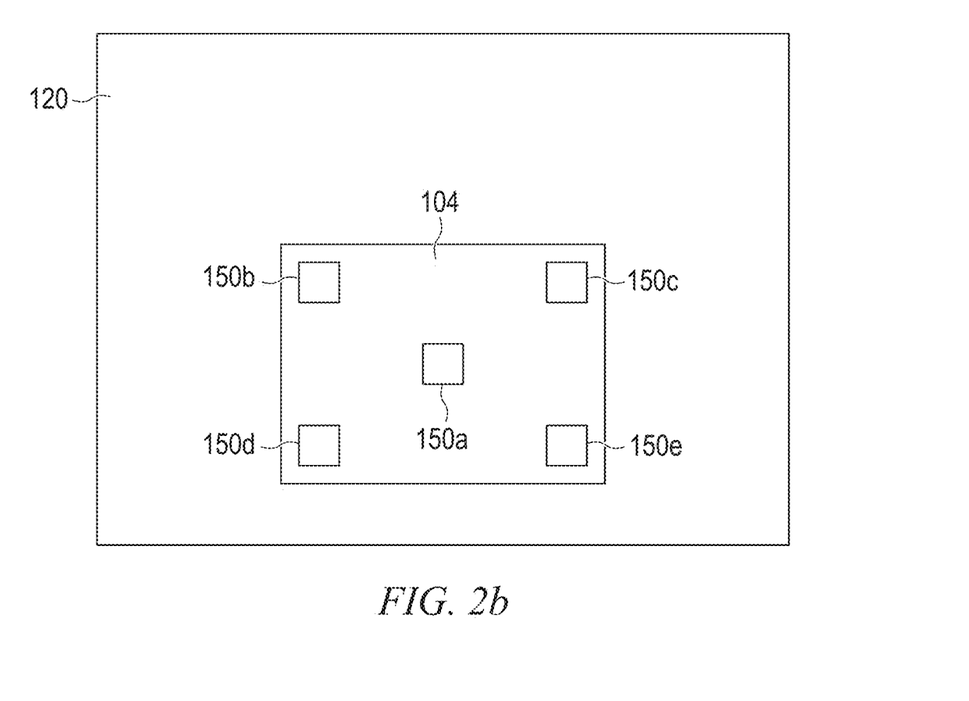
Figure 2C:
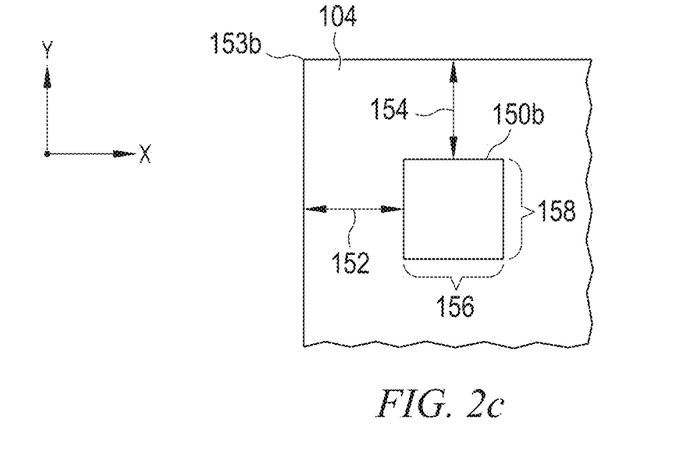
Figure 2D:
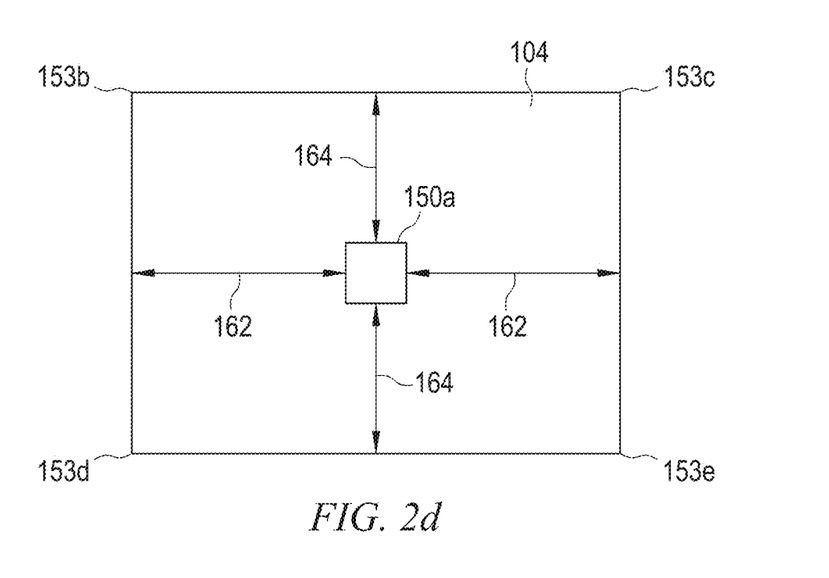

FIG. 2b illustrates a plurality of regions of interest (ROI) 150 where temperature is monitored. Five ROI 150 are commonly used: one ROI 150a at the center of die 104 and an ROI 150b-150e at each of the four corners. FIGS. 2c and 2d illustrate details of ROI 150. ROI 150b in FIG. 2c is formed a distance 152 from corner 153b of semiconductor die 104 along the X-axis and a distance 154 from the corner along the Y-axis. Each of the corner ROI 150b-150e are positioned the same distance (152, 154) from a respective corner 153b-153e so that only two distance parameters need to be configured. In other embodiments, ROI 150b-150e can be positioned independently.

ROI 150a at the center of die 104 is positioned equidistant between each pair of opposing sides of the die as shown in FIG. 2d. ROI 150a is positioned the same distance 162 from each corner 153b-153e along the X-axis and the same distance 164 from each corner in the Y-direction. ROI 150a is centered on die 104.

Each ROI 150a-150e is typically the same size, a dimension 156 along the X-axis and a dimension 158 along the Y-axis. If dimensions 156 and 158 are different, ROI 150 are rectangular. If dimension 156 equals dimension 158, ROI 150 are square. ROI 150 are shaped differently from each other or shaped irregularly in other embodiments.

Distances 152, 154, 162, and 164 and dimensions 156 and 158 are all measured in number of pixels on the image captured by IR camera 136. The goal during LAB is to monitor temperature on fixed pixels of IR camera 136 relative to the corners of semiconductor die 104. Due to the realities of manufacturing equipment having moving mechanical parts, IR camera 136 can move slightly relative to the rest of LAB assembly 130 during the manufacturing process. If IR camera 136 is moved slightly, then the pixels of IR camera 136 being monitored will no longer be in the correct location relative to the corners of semiconductor die 104.

Figure 2E:
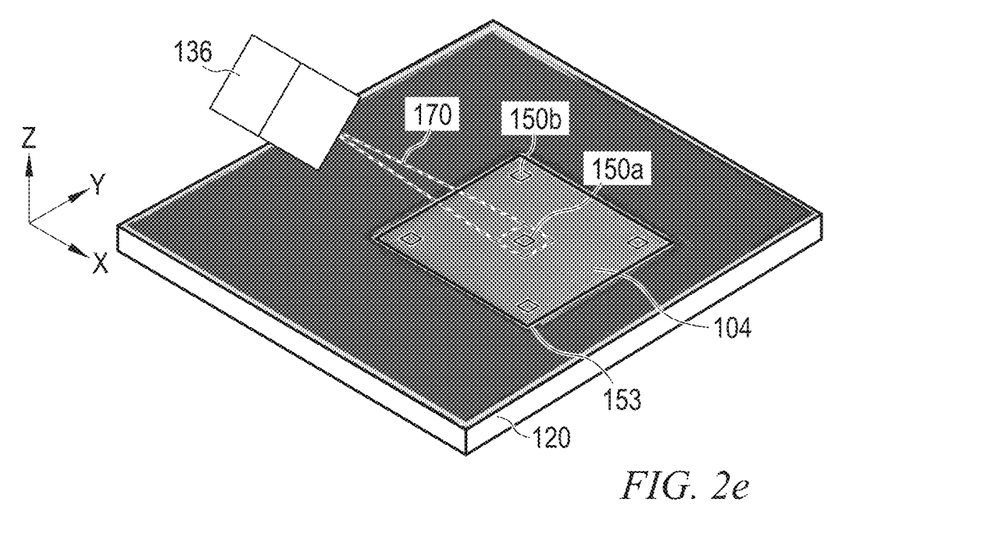
Figure 2F:
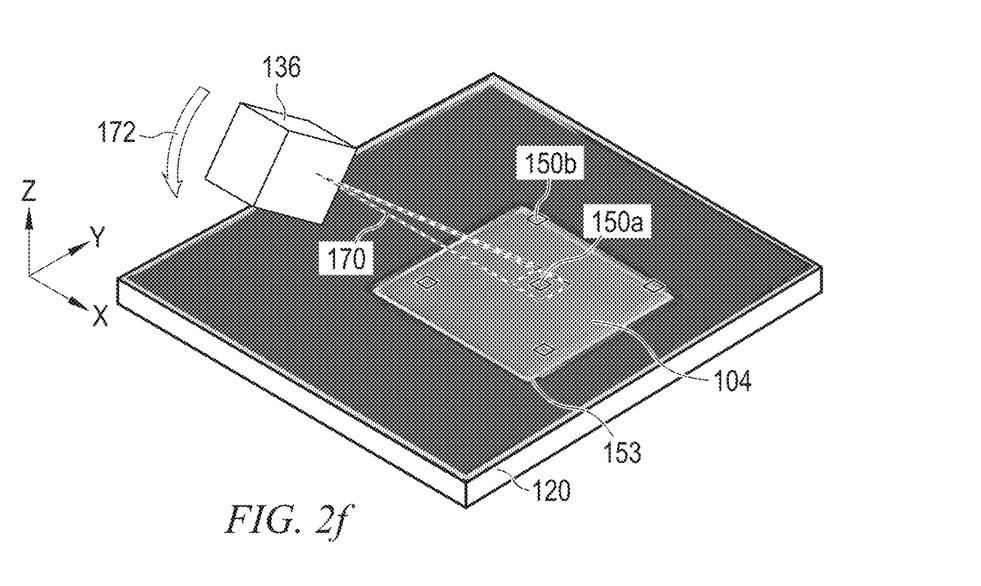

FIGS. 2e and 2f show such a misplacement of ROI 150. An exemplary image from IR camera 136 is superimposed onto substrate 120. ROI 150a is placed at area 170 of the IR camera's view, and ROI 150b-150e are appropriately placed in the image to be the desired number of pixels from the corners of die 104. In FIG. 2e, area 170, and therefore ROI 150a, is aligned to the center of semiconductor die 104. Because of the alignment, ROI 150b-150e are each equidistant from their respective corners 153 as intended.

FIG. 2f shows misalignment, which can be caused by a number of factors. Most common is a bad machine conversion between different ROI positions when different devices are being worked on or a camera tilt change during movement that causes an angular offset 172. Angular offset 172 can easily occur when moving LAB assembly 130 between units on carrier 122 or when loading a new batch of units. Instead of having an angle of exactly 70 degrees for example, the angle will inadvertently be off by a fraction of a degree.

Angular offset 172 is enough to significantly move ROI 150 within the footprint of semiconductor die 104, as shown in FIG. 2f. With offset 172, ROI 150 are moved in the Y direction until ROI 150b and 150c are barely on the edge of semiconductor die 104 and ROI 150d and 150e are moved a significant way toward the center of the die. The LAB process will continue with the same ROI 150 pixels being monitored relative to area 170 of the IR camera's view. However, the monitored pixels are no longer positioned on the actual points on semiconductor 104 that are of interest because area 170 has moved. ROI 150 in the IR camera 136 image are no longer aligned to the areas of semiconductor die 104 that are actually of interest.

Figure 2G:
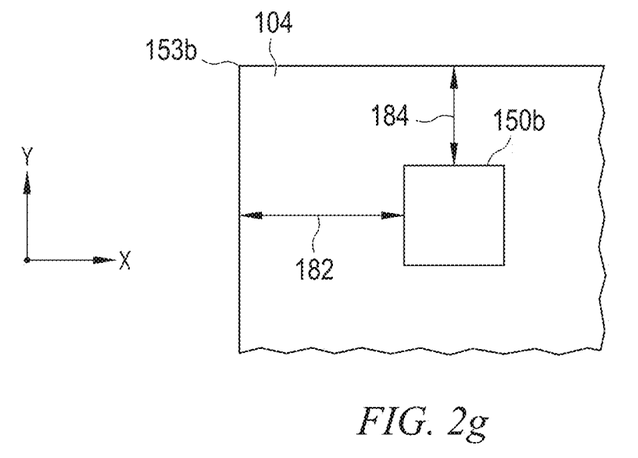

FIG. 2g shows detail of a misplaced ROI 150b. IR camera 136 has been moved such that distance 182 between ROI 150b and corner 153b in the X direction is significantly greater than a distance 184 between the corner and the ROI in the Y direction. The location actually being monitored by IR camera 136 is not the intended location for ROI 150b.

Figure 2H:
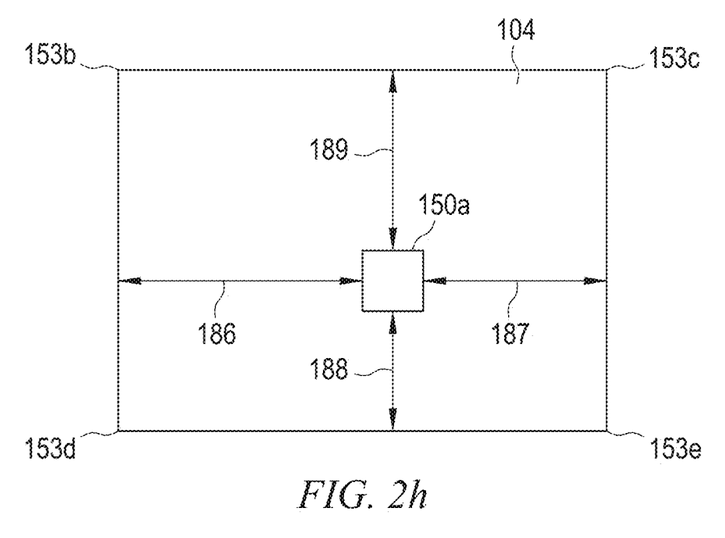

Similarly, FIG. 2h shows a misplaced ROI 150a. ROI 150b should be centered on semiconductor die 104. However, movement of IR camera 136 has moved ROI 150a on both the X and Y axes. A distance 186 between ROI 150a and corner 153b in the X direction is different from a distance 187 between the ROI and corner 153c in the X direction, although the distances should be the same. A distance 188 between ROI 150a and corner 153b in the Y direction is different from a distance 189 between the ROI and corner 153d in the Y direction, although again the distances should be the same. The location actually being monitored as ROI 150a by IR camera 136 is not centered on semiconductor die 104 as intended.

Figure 3A:
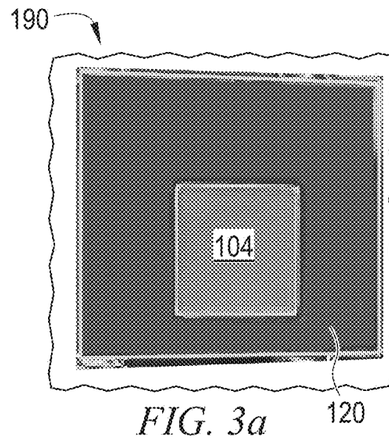
FIGS. 3a-3e illustrate automatic ROI alignment.

FIGS. 3a-3e illustrate a method and system for automatic ROI positioning. The images in FIGS. 3a-3e are from the point of view of IR camera 136. IR image 190 in FIG. 3a is a raw image captured by IR camera 136. Computer image processing is used to take IR image 190 as an input and then output a pixel map 192 showing boundary 200 of semiconductor die 104 in FIG. 3b. The image processing to generate pixel map 192 involves any combination of filtering, increasing contrast, sharpening, smoothening, binarization (i.e., converting pixels into one of two possible values, e.g., 1 or 0), etc. suitable to positively identify boundary 200. Other visual features, such as components disposed on substrate 120 adjacent to semiconductor die 104, can be eliminated based on the known approximate shape and location of the semiconductor die.

Figure 3B:
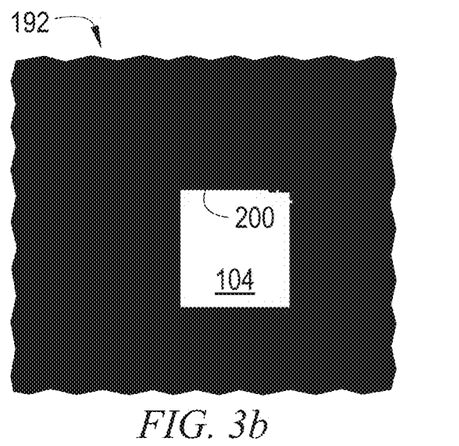

After image processing, the resultant image in FIG. 3b shows the footprint of die 104 as white and substrate 120 outside of the die as black. Black and white are used as those colors are highly contrasted to a human eye. However, any two numerical values could be used to distinguish the area of die 104 from substrate 120. The computer processed image can be used by a computer algorithm to identify boundary 200 by looking for the boundaries between black pixels and white pixels.

Figure 3C:
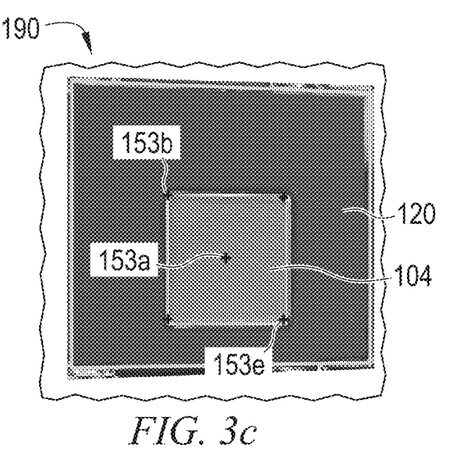

Using bitmap 192, the exact pixel locations of die center 153a and corners 153b-153e can be easily identified as shown in FIG. 3c. Corners 153b- 153e are identified as the furthest white pixel out in each direction. Center 153a is identified as the average position between the four corners. Conversion from corners 153b- 153e to the locations of ROI 153b- 153e is a simple matter of adding or subtracting distances 152 and 154 from each corner pixel 153b- 153e to find the location of a corresponding ROI.

Figure 3D:
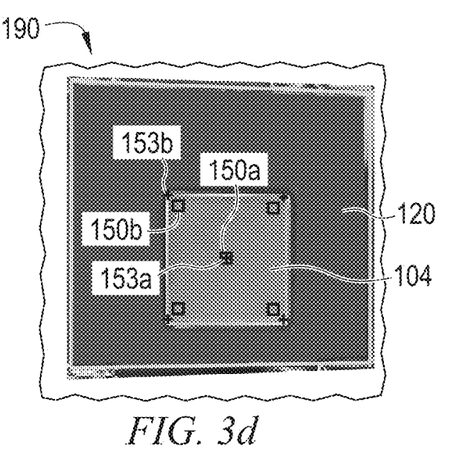
Figure 3E:
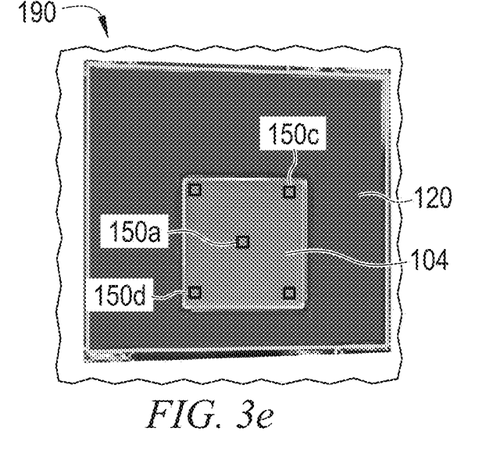

FIG. 3d shows ROI 150 superimposed onto IR image 190 along with markers 153 for the center and corners determined from bitmap 192. FIG. 3e shows just the resulting ROI 150. In one embodiment, the image processing software used to generate bitmap 192 also outputs a list of coordinates for center 153a and corners 153b-153e. In one embodiment, the user inputs a list of values for ROI size 156-158 and ROI distance from the die edge 152-154, and the image processing software outputs a list of coordinates for ROI 150 as shown in table 1 below.

TABLE 1

Coordinate point of ROI 150a: X-axis = 160 | Y-axis = 109
Coordinate point of ROI 150b: X-axis = 145 | Y-axis = 93
Coordinate point of ROI 150c: X-axis = 175 | Y-axis = 94
Coordinate point of ROI 150d: X-axis = 145 | Y-axis = 125
Coordinate point of ROI 150e: X-axis = 174 | Y-axis = 125

The ROI coordinate list from table 1, along with ROI size, can be manually entered or automatically imported into the LAB software that actually does the temperature monitoring for the ROI 150. The coordinates indicate a corner pixel for each ROI 150, which, along with the ROI size, tell the LAB software specifically which pixels of IR image 190 to monitor. The ROI pixels can be recalculated for each die 104 being bonded or the same pixels can be reused for each die 104 being processed either for an entire carrier 122 or for as long as different units of the same die 104 and substrate 120 are being processed. The coordinates can optionally be reused until LAB assembly 130 is manually touched, until a positioning error is detected, or automatically recalculated periodically (e.g., daily or hourly).

Figure 4A:
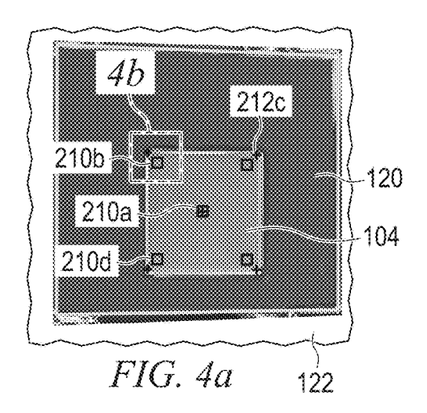
FIGS. 4a-4c illustrate one ROI alignment example.
Figure 4B:
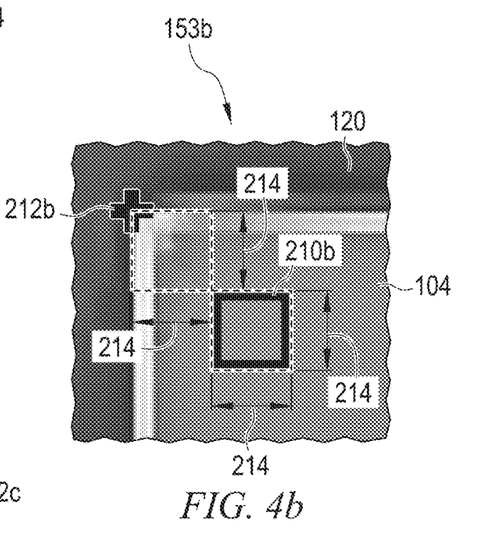
Figure 4C:
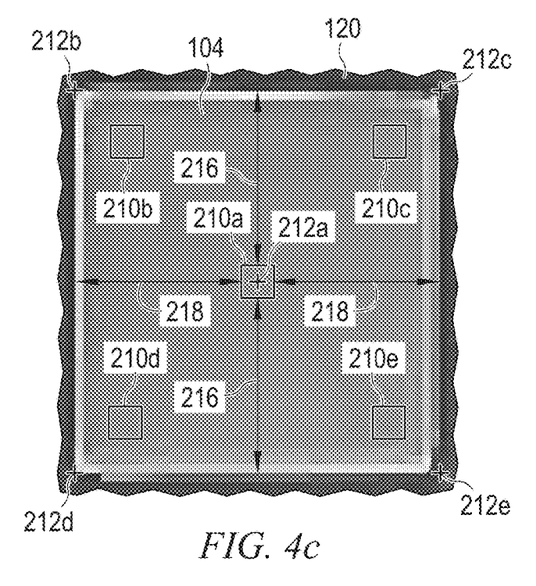

FIGS. 4a-4c illustrate one example with a distance from each corner of 4 pixels and an ROI size of 4 pixels in each direction. FIG. 4a shows substrate 120 as seen by IR camera 136 with ROI 210 and location markers 212. FIG. 4b is a close-up view of corner 153b. FIG. 4c is a view zoomed in on die 104. To begin, the user inputs the distance and size parameters into the image processing system. For FIGS. 4a-4c, the same value of 4 pixels is input for each of the parameters 214.

The image processing software creates a bitmap showing the exact location of die 104 in the IR image, and then automatically pinpoints the exact pixels for the corners as indicated by markers 212b-212e and the center as indicated by marker 212a. The image processing software then places ROI 150a-150e based on the pixels identified by the markers. ROI 210b-210e are placed with one corner four pixels inward in both the X and Y directions from markers 212b-212e, respectively. The opposite corner of each corner ROI 210b-210e is placed four additional pixels inward in both the X and Y directions.

Center marker 212a is placed at the average position of all four corner markers 212b-212e. Center ROI 210a is placed at center marker 212a with a size of four pixels by four pixels. A distance 216 in the Y direction is the same between edges of semiconductor die 104 in both directions. A distance 218 in the X direction is the same between edges of semiconductor die 104 in both directions. The square representations of ROI 210b-210e illustrate the pixels of the image that will be monitored during LAB.

Figure 5A:
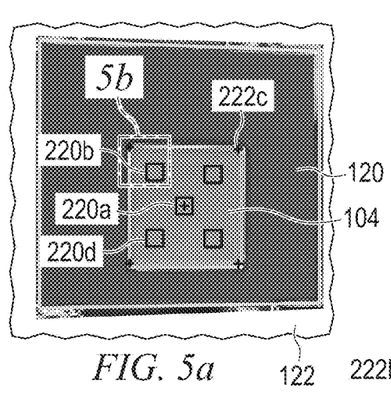
FIGS. 5a-5c illustrate another ROI alignment example.
Figure 5B:
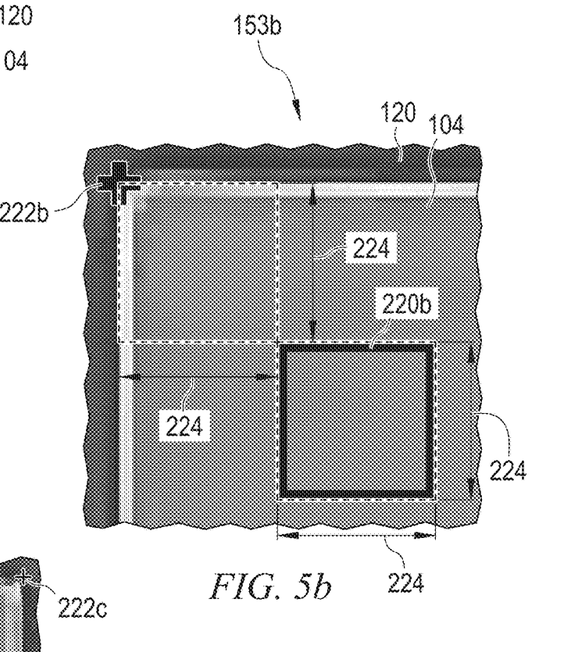
Figure 5C:
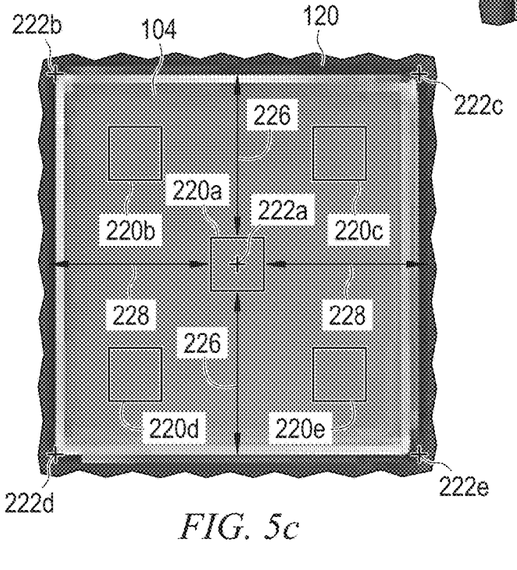

FIGS. 5a-5c illustrate another example with a distance from each corner of 8 pixels and an ROI size of 8 pixels in each direction. FIG. 5a shows substrate 120 as seen by IR camera 136 with ROI 220 and location markers 222. FIG. 5b is a close-up view of corner 153b. FIG. 5c is a view zoomed in on die 104. For FIGS. 5a-5c, the user begins by entering eight pixels for all the distance parameters 224.

The image processing software creates a bitmap showing the exact location of die 104 in the IR image, and then pinpoints the exact pixels for the corner as indicated by markers 222b-222e. The image processing software places one corner of corner ROI 220b-220e eight pixels inward in both the X and Y directions from markers 222b-222e, respectively. The opposite corner of each corner ROI 220b-220e is placed eight additional pixels inward in both the X and Y directions.

A center marker 222a is placed at the average position of all four corner markers 222b-222e. Center ROI 220a is placed at center marker 222a with a size of eight pixels by eight pixels. A distance 226 in the Y direction is the same between edges of semiconductor die 104 in both directions. A distance 228 in the X direction is the same between edges of semiconductor die 104 in both directions. The square representations of ROI 220b-220e correspond to the pixels of the image that will be monitored during LAB. LAB proceeds with the pixels identified as ROI being monitored to keep temperatures of semiconductor die 104 within acceptable limits.

Figures 6A, 6B:
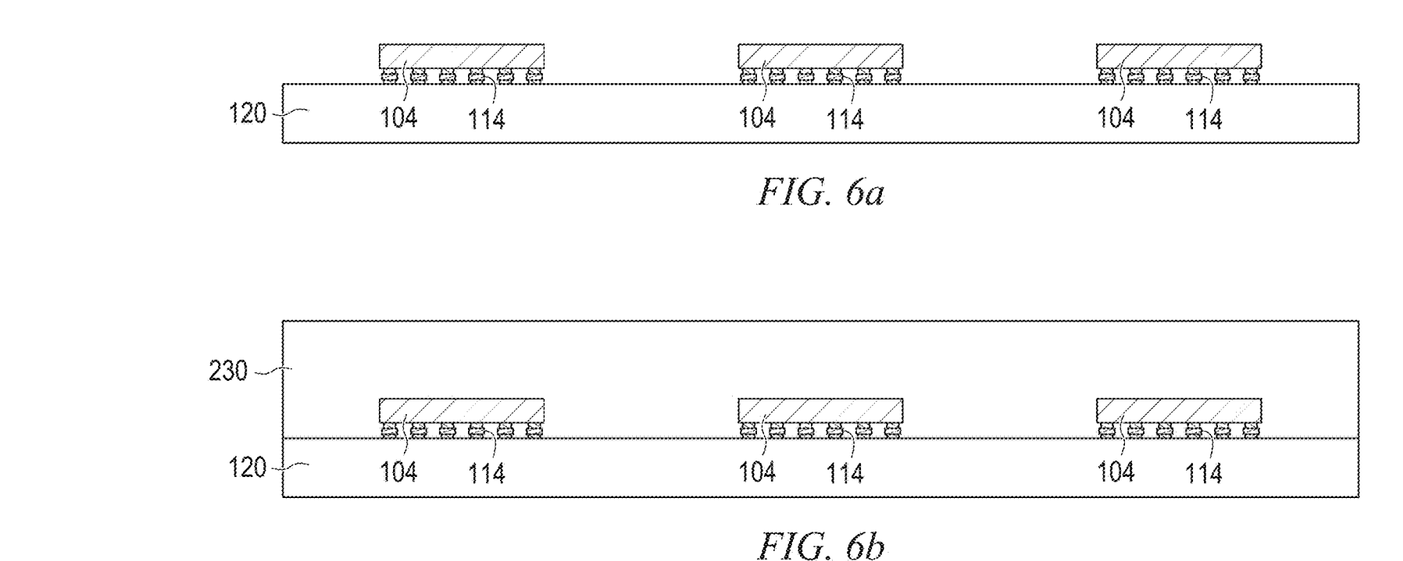
FIGS. 6a-6c illustrate completion of a semiconductor package after laser-assisted bonding.

Once all die 104 on a substrate 120 are bonded via LAB, manufacturing proceeds with other desired steps. Any type of package can be formed. Just one example of the many possibilities in FIG. 6a shows a plurality of die 104 are bonded to substrate 120. An encapsulant or molding compound 230 is deposited over substrate 120 in FIG. 6b using paste printing, compressive molding, transfer molding, liquid encapsulant molding, vacuum lamination, spin coating, or another suitable applicator. Encapsulant 230 can be polymer composite material, such as epoxy resin, epoxy acrylate, or polymer with or without a filler. Encapsulant 230 is non-conductive, provides structural support, and environmentally protects the semiconductor device from external elements and contaminants.

Figure 6C:
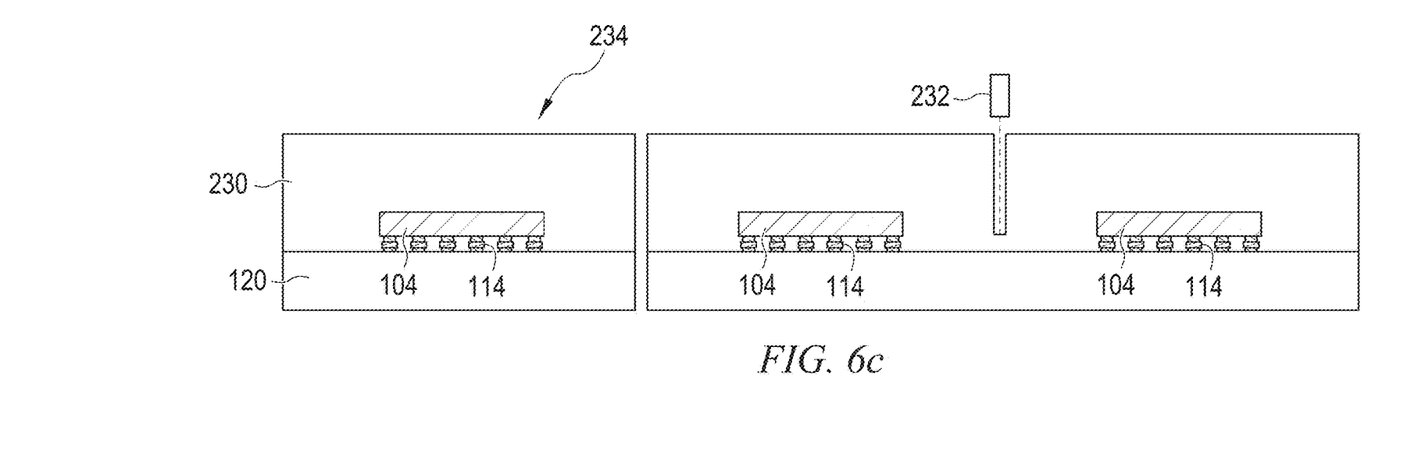

The panel formed by substrate 120 and encapsulant 230 is singulated in FIG. 6c using a saw blade, water cutting tool, or laser cutting tool 232 into individual semiconductor packages 234. Packages 234 are usually stored in a tape-and-reel after singulation for distribution to electronic device manufacturers who will integrate the devices into their products. Substrate 120 includes electrically conductive layers and other interconnect structures used to route signals through the substrate. The bottom surface of substrate 120, opposite die 104, will typically have a ball grid array, land grid array, or other type of interconnect structure for electrical connection to the larger electronic device.

FIGS. 6a-6c are intended to illustrate just one of the many different ways a package can be completed after laser-assisted bonding. Any type of substrate can have a semiconductor die bonded thereto with laser-assisted bonding, and any processing desired can be performed after laser-assisted bonding to form any kind of end package. The disclosed ROI placement method can work for any situation where LAB is used.

Figure 7:
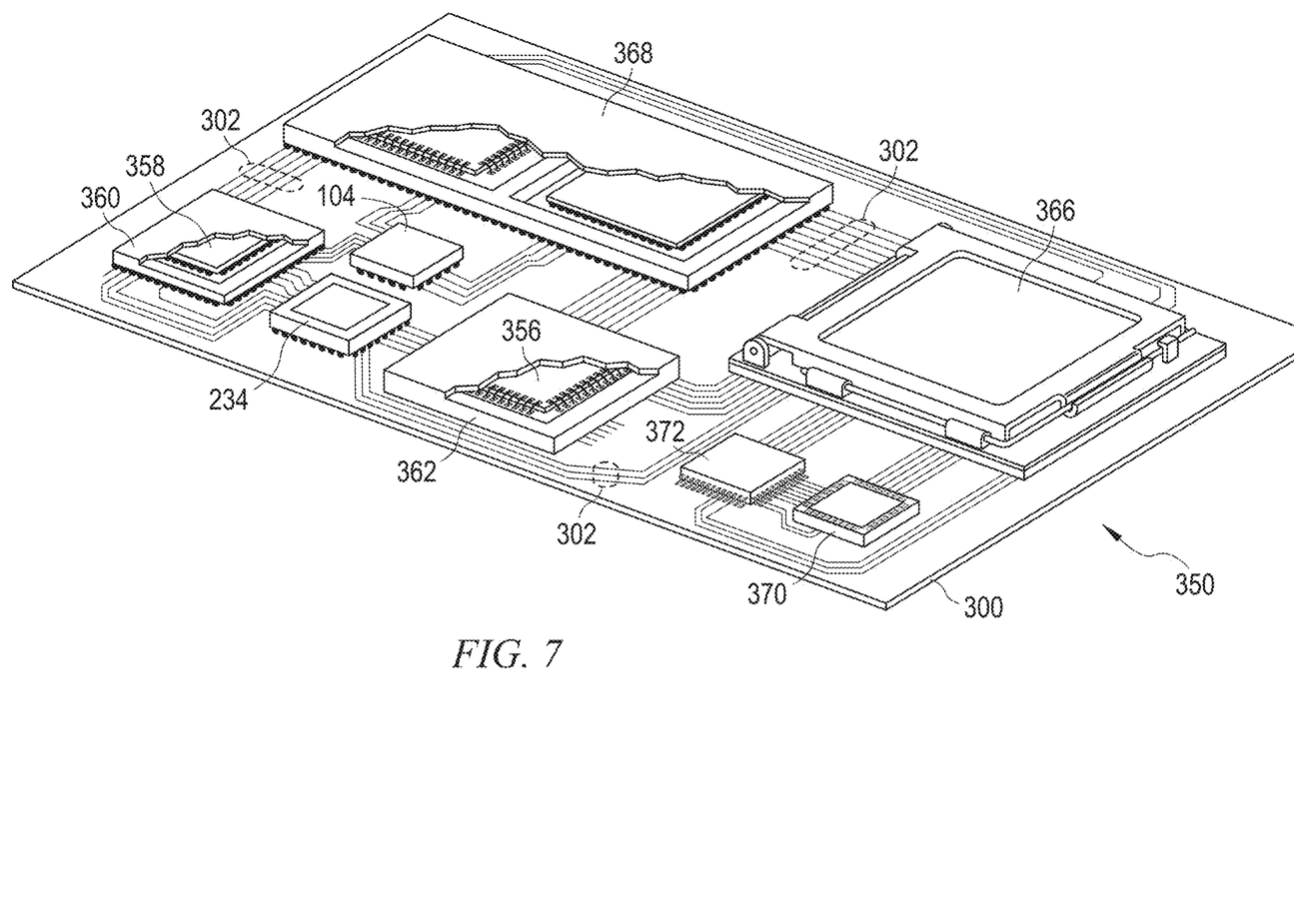
FIG. 7 illustrates an electronic device with laser-assisted bonded devices.

FIG. 7 illustrates electronic device 350 including PCB 300 with a plurality of semiconductor packages mounted on a surface of the PCB, including a package 234 and a die 104. Electronic device 350 can have one type of semiconductor package, or multiple types of semiconductor packages, depending on the application. Die 104 mounted directly to PCB 300 shows that the die-beam alignment process can be used for mounting a die directly to a device substrate 300, in addition to a package substrate 120.

Electronic device 350 can be a stand-alone system that uses the semiconductor packages to perform one or more electrical functions. Alternatively, electronic device 350 can be a subcomponent of a larger system. For example, electronic device 350 can be part of a tablet computer, cellular phone, digital camera, communication system, or other electronic device. Electronic device 350 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

PCB 300 provides a general substrate for structural support and electrical interconnection of the semiconductor packages mounted on the PCB. Conductive signal traces 302 are formed over a surface or within layers of PCB 300 using evaporation, electrolytic plating, electroless plating, screen printing, or other suitable metal deposition process. Signal traces 302 provide for electrical communication between the semiconductor packages, mounted components, and other external systems or components. Traces 302 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 300. In other embodiments, a semiconductor device may only have the first level packaging where the die is mechanically and electrically mounted directly to PCB 300.

For the purpose of illustration, several types of first level packaging, including bond wire package 356 and flipchip 358, are shown on PCB 300. Additionally, several types of second level packaging, including ball grid array (BGA) 360, bump chip carrier (BCC) 362, land grid array (LGA) 366, multi-chip module (MCM) 368, quad flat non-leaded package (QFN) 370, and quad flat package 372 are shown mounted on PCB 300 along with die 104 and package 234. Conductive traces 302 electrically couple the various packages and components disposed on PCB 300.

Depending upon the system requirements, any combination of semiconductor packages, configured with any combination of first and second level packaging styles, as well as other electronic components, can be connected to PCB 300. In some embodiments, electronic device 350 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   disposing a laser-assisted bonding (LAB) assembly including an infrared (IR) camera over the semiconductor die;
   capturing an image of the semiconductor die using the IR camera;
   performing image processing on the image to identify corners of the semiconductor die; and
   identifying regions of interest (ROI) in the image relative to the corners of the semiconductor die.

2. The method of claim 1, further including identifying the ROI using input parameters for a distance of the ROI from respective corners of the semiconductor die.

3. The method of claim 2, further including identifying the ROI using input parameters for a size of the ROI.

4. The method of claim 1, further including:
   providing a plurality of semiconductor die;
   moving the LAB assembly over each semiconductor die to individually perform laser-assisted bonding; and
   automatically identifying ROI for each semiconductor die after moving the LAB assembly to the respective semiconductor die.

5. The method of claim 1, further including monitoring temperatures of the ROI using the IR camera while performing laser-assisted bonding with the LAB assembly.

6. The method of claim 1, wherein performing image processing includes binarization.

7. A method of making a semiconductor device, comprising:
   providing a semiconductor die;
   capturing an infrared (IR) image of the semiconductor die using an IR camera;
   performing image processing on the IR image to identify corners of the semiconductor die; and
   identifying regions of interest (ROI) in the IR image relative to the corners of the semiconductor die.

8. The method of claim 7, further including performing laser-assisted bonding (LAB) on the semiconductor die while monitoring temperatures of the ROI with the IR camera.

9. The method of claim 8, further including depositing an encapsulant over the semiconductor die after performing LAB.

10. The method of claim 7, further including capturing the IR image and identifying the ROI periodically.

11. The method of claim 7, wherein performing image processing includes binarization.

12. The method of claim 7, further including identifying the ROI using input parameters for a distance of the ROI from respective corners of the semiconductor die.

13. The method of claim 7, further including identifying the ROI using input parameters for a size of the ROI.

14. A method of making a semiconductor device, comprising:
   providing a semiconductor die;
   capturing an image of the semiconductor die;
   identifying a corner of the semiconductor die in the image; and
   identifying a region of interest (ROI) in the image relative to the corner of the semiconductor die.

15. The method of claim 14, further including identifying the ROI using an input parameter for a distance of the ROI from the corner of the semiconductor die.

16. The method of claim 14, further including identifying the ROI using an input parameter for a size of the ROI.

17. The method of claim 14, further including monitoring a temperature of the ROI while performing laser-assisted bonding on the semiconductor die.

18. The method of claim 17, further including depositing an encapsulant over the semiconductor die after performing LAB.

19. The method of claim 14, further including identifying the corner of the semiconductor die by performing image processing on the image.

20. The method of claim 14, further including capturing the image and identifying the ROI periodically.

21. A semiconductor manufacturing device, comprising:
   a laser-assisted bonding (LAB) assembly;
   an infrared (IR) camera attached to the LAB assembly; and
   a computer configured to find a corner of a semiconductor die in an image captured by the IR camera.

22. The semiconductor manufacturing device of claim 21, wherein the computer is configured to calculate a region of interest (ROI) relative to the corner.

23. The semiconductor manufacturing device of claim 22, further including a parameter defining a location of the ROI relative to the corner.

24. The semiconductor manufacturing device of claim 23, further including a parameter defining a size of the ROI.

25. The semiconductor manufacturing device of claim 21, further including a semiconductor die disposed under the LAB assembly.

* * * * *